(12) United States Patent
Beasley et al.

(10) Patent No.: US 9,595,436 B2
(45) Date of Patent: Mar. 14, 2017

(54) GROWING GRAPHENE ON SUBSTRATES

(71) Applicant: Applied Materials, Inc., Santa Clara, CA (US)

(72) Inventors: Cara Beasley, Scotts Valley, CA (US); Ralf Hofmann, Soquel, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/425,578

(22) PCT Filed: Oct. 24, 2013

(86) PCT No.: PCT/US2013/066501
§ 371 (c)(1),
(2) Date: Mar. 3, 2015

(87) PCT Pub. No.: WO2014/066574
PCT Pub. Date: May 1, 2014

(65) Prior Publication Data
US 2015/0235847 A1    Aug. 20, 2015

Related U.S. Application Data

(60) Provisional application No. 61/718,258, filed on Oct. 25, 2012.

(51) Int. Cl.
*B05D 5/12* (2006.01)
*H01L 21/02* (2006.01)
(Continued)

(52) U.S. Cl.
CPC .... *H01L 21/02527* (2013.01); *H01L 21/0234* (2013.01); *H01L 21/02318* (2013.01);
(Continued)

(58) Field of Classification Search
USPC .......................... 427/122, 288, 535, 553, 228
See application file for complete search history.

(56) References Cited

U.S. PATENT DOCUMENTS 5,512,330 A * 4/1996 Dearnaley ................ B05D 1/60
427/122
7,790,226 B2 * 9/2010 Tai .......................... C23C 18/02
427/228
(Continued)

FOREIGN PATENT DOCUMENTS

| KR | 2010-0056998 A | 5/2010 |
| KR | 20120081977 A | 7/2012 |
| WO | 2012-044284 A1 | 4/2012 |

OTHER PUBLICATIONS

International Search Report and Written Opinion issued in PCT/US2013/066501 mailed Feb. 12, 2014.

*Primary Examiner* — Brian K Talbot
(74) *Attorney, Agent, or Firm* — Patterson & Sheridan, LLP (57) ABSTRACT

Embodiments described herein provide methods and apparatus for forming graphitic carbon such as graphene on a substrate. The method includes providing a precursor comprising a linear conjugated hydrocarbon, depositing a hydrocarbon layer from the precursor on the substrate, and forming graphene from the hydrocarbon layer by applying energy to the substrate. The precursor may include template molecules such as polynuclear aromatics, and may be deposited on the substrate by spinning on, by spraying, by flowing, by dipping, or by condensing. The energy may be applied as radiant energy, thermal energy, or plasma energy.

19 Claims, 3 Drawing Sheets

(51) Int. Cl.
  *B05D 3/06* (2006.01)
  *B05D 3/14* (2006.01)

(52) U.S. Cl.
  CPC ........ *H01L 21/02345* (2013.01); *B05D 3/061* (2013.01); *B05D 3/065* (2013.01); *B05D 3/141* (2013.01); *B05D 5/12* (2013.01)

(56) References Cited

U.S. PATENT DOCUMENTS

| | | | |
|---|---|---|---|
| 8,808,810 B2 * | 8/2014 | Veerasamy | B82Y 30/00 174/126.1 |
| 2005/0287064 A1 | 12/2005 | Mayne et al. | |
| 2009/0324897 A1 * | 12/2009 | Choi | B82Y 30/00 428/195.1 |
| 2011/0303899 A1 | 12/2011 | Padhi et al. | |
| 2012/0015098 A1 * | 1/2012 | Cheng | C09D 11/52 427/110 |
| 2013/0284338 A1 * | 10/2013 | Xiao | C01B 31/0206 156/60 |

* cited by examiner

GROWING GRAPHENE ON SUBSTRATES

BACKGROUND OF THE INVENTION

Field of the Invention

Embodiments of the present invention generally relate to an apparatus and a method of growing graphene on various substrates for different applications.

Description of the Related Art

Graphene is a flat monolayer of polycyclic carbon atoms arranged into a quasi two-dimensional (2D) honeycomb lattice of mostly $sp^2$ bonds, and is a basic building block for graphitic carbon material of other dimensionalities. Graphene can be wrapped into 0D fullerenes, rolled into 1D nanotubes or stacked into 3D graphites. Graphite is generally not useful for electronic devices, whereas graphene, with its intrinsic semi-metal and zero-gap electric properties, tunable band gap, and strong mechanical strength (as one of the strongest materials ever tested), is a suitable material for integrated circuit (IC) fabrication (e.g., for constructing quantum computers using anionic circuits). Graphene is proposed to be used in many different applications, such as gas sensors, nano-electronics, interconnects, transistors, transparent conducting electrodes, ultracapacitors, solar cells, ITO replacement, engineered piezoelectricity, diffusers, distillation of ethanol, membrane-type devices, graphene nano-ribbons, graphene optical modulators, graphene bio-devices, and many others. However, graphene is currently only grown in the lab and no efficient process for making graphene exists, making it very expensive to grow. For example, graphene produced by exfoliation is among the most expensive materials on Earth.

Graphene can be grown in a CVD or epitaxial process onto a metal-containing catalyst surface (e.g., substrates with nickel or copper on their surfaces to seed the growth of graphene) using a gaseous carbon source that requires very high deposition temperatures (e.g., 900° C. or higher) and is difficult to grow directly on silicon substrates, and graphene grown on metal and transferred to non-metal substrates requires meticulous surface attachment in many cases to achieve conductivity. Graphene has been shown to grow on silicon carbide substrates using an epitaxial process or a silicon evaporation process, but the temperature has to be higher than 1,000° C. Graphene may also be formed by reduction of graphene oxide sheets at high temperatures. These applications of growing graphene films are not suitable for most device fabrication due to thermal budget requirements. For example, substrates for CMOS devices typically have a temperature threshold at about 400° C.

Furthermore, even at high temperatures, current CVD or epitaxial graphene growing processes require long deposition times, due to low reactivity of the gaseous carbon sources used and low efficiency in incorporating reactive species into a growing graphene film. Further, CVD or epitaxial-deposited graphene films are not uniform, resulting in randomly oriented grains at sizes less than one square millimeter (mm) and varying numbers of graphene layers. Growth is often nucleated at a number of locations simultaneously, contributing to the formation of randomly oriented grains in a graphene monolayer/sheet.

Assembly of the gaseous reactive species on the surface of a substrate in a manner that is conducive to a monolayer of graphene growth is a major challenge. The gaseous precursors participate in a number of side reactions resulting in a loss of reactive species, polymerization with unwanted functional groups, and undesirable side products, all of which decrease the number of active precursor molecules available for graphene growth. Thus, there is a need to find a wider range of precursors and source compounds for growing graphene.

Graphene's electric properties are strongly linked to its thickness and length. For example, a graphene monolayer is less than 1 nm thick, typically at about 3 angstroms, as compared to the thickness of a semi-conductor film generally between 150 angstroms to 5000 angstroms. Most graphitic carbon films are grown to a thickness of 100 nm or thicker. In some such films, patches or spots of graphene at a length of about 1-2 microns have been observed. Such patches are not long enough for device applications, however, and it is difficult to grow graphene that covers the whole surface of a substrate (e.g., a silicon wafer).

Therefore, there is a need to develop a low temperature process, to find new precursors, and to grow high quality graphene films on a larger scale for graphene's many industrial applications.

SUMMARY OF THE INVENTION

Embodiments described herein provide methods and apparatus for forming graphitic carbon such as graphene on a substrate. The method includes providing a precursor comprising a linear conjugated hydrocarbon, depositing a hydrocarbon layer from the precursor on the substrate, and forming graphene from the hydrocarbon layer by applying energy to the substrate. The precursor may include template molecules such as polynuclear aromatics, and may be deposited on the substrate by spinning on, by spraying, by flowing, by dipping, or by condensing. The energy may be applied as radiant energy, thermal energy, or plasma energy.

An apparatus for practicing methods described herein includes a chamber with a rotatable substrate support and a fluid applicator. A source of hydrocarbon fluids is coupled to the applicator. One or more radiant sources may be disposed in the chamber for exposing a substrate to radiant energy, such as UV radiation. Gas may be flowed through the chamber through an inlet and outlet. Fluid application and UV exposure may be performed in the same chamber or in different chambers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

It has been found that graphene can be readily grown on a substrate by forming a thin film of a pre-ordered hydrocarbon precursor material that readily assembles into graphene by application of energy. Suitable hydrocarbon precursor materials are typically planar or quasi-planar molecules that have no significant three-dimensional functionality. Hydrocarbon molecules that have conjugated bonds lying substantially in one plane are useful in this regard. Template molecules may also be used to facilitate selective growth of graphene more than three-dimensional graphitic carbon. The dimensionality of the carbon material may be influenced or controlled by adjusting the amount of three-dimensional precursors in the thin film. Graphene is produced by applying energy to the thin film, in the form of radiant energy, thermal energy, or plasma.

Substrates on which a graphene film may be formed using methods described herein include semiconductor substrates such as silicon, germanium, silicon-germanium, compound semiconductors such as III/V and II/VI semiconductors, combinations thereof. Also included are substrates having a dielectric surface material such as metal oxides, ceramics, metal nitrides, semiconductor oxides such as silicon oxides, semiconductor nitrides such as silicon nitrides, metal and semiconductor oxynitrides, semiconductor carbides, carbohydrides, and oxycarbohydrides, plastic, rubber, and combinations thereof. Metals such as copper, aluminum, gold, silver, and combinations thereof, are also included. Notably, methods described herein may be used to form a graphene film on a substrate having regions of different composition such as semiconductor regions, dielectric regions, and metal regions, as would be encountered with a typical semiconductor device substrate having conductive and dielectric features.

Figure 1:
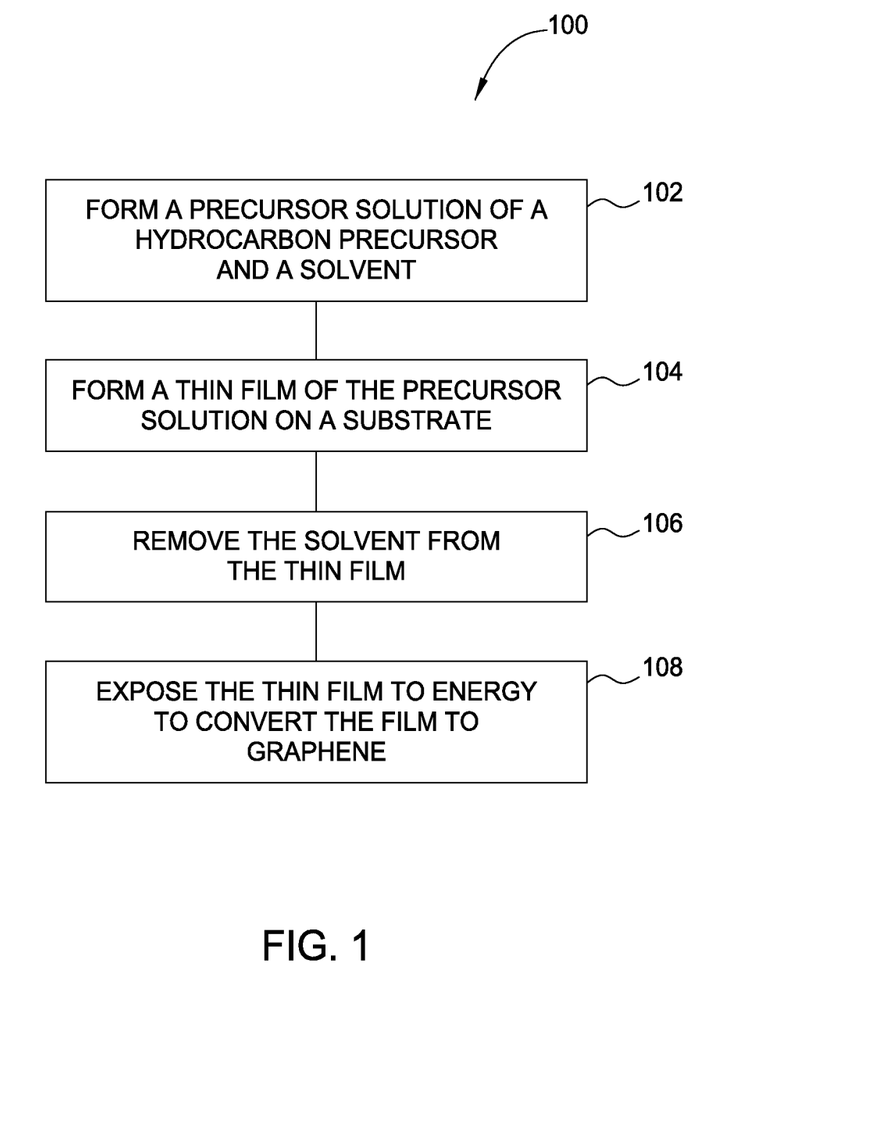
FIG. 1 is a flow chart summarizing a method according to one embodiment.

FIG. 1 is a flow diagram summarizing a method 100 according to one embodiment. A precursor solution is formed at 102. The precursor solution has a hydrocarbon precursor and a solvent. The hydrocarbon precursor is a compound or mixture of compounds that readily forms a conjugated planar carbon network when exposed to energy. Compounds suitable for such purposes are typically planar compounds or linear compounds with no significant three-dimensional functionality. Linear hydrocarbons such as linear paraffins, linear olefins, and linear dienes and/or poly-enes may be used. Conjugated dienes and poly-enes are often useful for forming a graphene sheet. In one embodiment, 1,3 pentadiene (also known as piperylene) is used as a graphene precursor. Other suitable precursors usable alone or in mixtures include 1,3 butadiene, 1,3 hexadiene, 2,4 pentadiene, 2,4 hexadiene, and 1,3,5 heptatriene. Linear olefins that may be used alone or in mixtures with other compounds include all isomers of hexene, pentene, and butene. Aromatic molecules, such as benzene, toluene, and xylene, and derivatives such as styrene, vinyl benzene, and the like, may also be used. Parylene (i.e., paraxylene monomer, dimer, or polymer) may also be used as a precursor. Cycloaliphatic hydrocarbons such as cyclohexane and substituted variants thereof may also be used.

Compounds useful as hydrocarbon precursors for graphene film formation also include template compounds that facilitate or encourage formation of a conjugated carbon monolayer. Planar aromatic compounds such as benzene or polynuclear aromatics may be useful in this regard. In one embodiment, pyrene is used as a template compound. Other template compounds include naphthalene, anthracene, phenanthrene, chrysene, perylene, coronene, hexabenzoperi­coronene, benza and benzo deriviatives thereof, partially or fully hydrogenated derivatives thereof, and combinations thereof.

The solvent is typically a volatile compound easily removed at relatively low temperature and having a low viscosity. The solvent may be aprotic, for example a hydrocarbon such as pentane, isopentane, hexane, benzene, cyclohexane, hexene, isopentene, toluene, heptane, isohexane, heptene, isohexene, and mixtures and derivatives thereof. The solvent may also be protic, for example an oxygenated organic compound like ethers, alcohols, ketones, aldehydes, or carboxylic acids. Ethanol, isopropanol, and phenol may be used in some embodiments. Protic solvents can be helpful in lowering the energy threshold of the graphene formation reaction. Additionally, volatile solvents with radical affinity or hydrogen affinity may also be useful. The solvent may also be a mixture of compounds, protic and aprotic, which may be selected to control preferential deposition of precursors on a substrate from solution.

The precursor solution is applied to a substrate at 104 to form a thin film. The thin film typically has a thickness less than about 10 nm, such as less than about 5 nm, for example about 3 nm. The precursor solution may be applied by any process capable of forming a thin film, including spin-on deposition, roll-on deposition, spray deposition, dipping, and condensation. The thin film is typically formed at a temperature not much above room temperature to facilitate adhesion of the precursors to the substrate. A thin film may be formed at a temperature from about −10° C. to about 300° C., such as between about 0° C. and about 100° C., for example about 25° C. or room temperature. Use of heavier or more viscous solvents will typically accompany higher deposition temperatures.

The precursor solution is typically formulated to have a viscosity of about 3.0 cP or less at room temperature to facilitate forming a thin film on the substrate. In a spin coating process, a film having a thickness of no more than about 5 nm may be formed by applying a fluid having a room temperature viscosity of about 3.0 cP or less to a substrate spinning at a rate of about 1000 revolutions per second for about 30 seconds. The particular conditions for forming a thin film by a spin-on process depend on the precursor composition, temperature, and substrate.

If a solvent is present, the solvent typically evaporates at least in part during the coating process. A spin coating process, in particular, can evaporate some or all of the solvent. It is therefore useful, in embodiments using solvents, to include enough solvent to achieve the desired film thickness before the film congeals. In some embodiments, solvent content and spin rate may be selected to provide a radial flow regime that helps orient molecules deposited on the substrate to improve the uniformity of the resulting graphene layer. It is believed that a pre-ordered film of the precursor molecules reduces formation of defects and grain boundaries in the graphene layer.

The precursor mixture may also be applied to the substrate using a dipping process. The substrate is disposed in a liquid holding chamber which is filled to a desired level with the dipping fluid, which may be any of the precursor compositions described herein. The substrate may be dipped vertically, horizontally, or at any angle between. Alternately, the precursor fluid may be applied to the substrate by a ribbon or edge applicator at one edge of the substrate and allowed to flow under gravity to an opposite edge of the substrate to form a film.

The precursor mixture may feature components that provide a degree of adhesion to the substrate, or the substrate surface may be prepared to facilitate a desired degree of adhesion between the substrate surface and the precursor mixture. Some adhesion of the precursor molecules to the substrate surface may be useful in embodiments featuring volatile components and/or elevated temperatures to slow volatilization of the molecules while carbon-carbon bonds are formed. In one aspect, electronegative functionalities may be added to a portion of the hydrocarbon precursor molecules if the surface to be coated is a hydrophillic surface, such as a metal. Electronegative functionalities, for example atoms having electronegativity of about 1.8 or higher attached to a terminal carbon of the molecule may promote adhesion of precursor molecules to the substrate. In some embodiments, a portion of the precursor molecules may be functionalized while other hydrocarbon molecules remain unfunctionalized. In such an embodiment, molecular affinities between the functionalized molecules and the non-functionalized molecules will provide a degree of adhesion for the precursor mixture tending to reduce unwanted volatility. Functional adherents that may be added to hydrocarbon molecules include silicon (i.e., silanes), germanium (i.e., germanes), boron (i.e., boranes), tin (i.e., stannanes), phosphorus (i.e., phosphines), nitrogen (i.e., amines), arsenic (i.e., arsines), and halogens (i.e., fluorocarbons and chlorocarbons). Van deer Waals interactions, such as hydrophobic interactions can also be used to promote surface adhesion and ordering. Hydrophobic molecules tend to stick to hydrophobic surfaces, such as pyrene on silicon, especially if the pyrene is suspended in a polar solvent. Thus, adhesion of a hydrophobic precursor to a hydrophobic surface may be promoted by suspending the hydrophobic precursor in a polar solvent.

At 106, the solvent is removed from the thin film to yield a stationary hydrocarbon film that may contain trace amounts of the solvent in a non-fluid matrix. The solvent may be removed by thermal volatilization at temperatures of about 150° C. or less, or at ambient or sub-ambient temperatures optionally in the presence of a flowing atmosphere. The resulting film may be a single molecular layer of carbon and hydrogen in a substantially ordered arrangement of precursor molecules, or the film may have regions of varying molecular thickness such as regions of molecular bilayers and trilayers. It is thought that graphene is most readily formed by a molecular monolayer of hydrocarbon, but graphene may also result in areas of hydrocarbon bilayers and trilayers. Graphitic carbon having a large fraction of graphene, for example about 80% graphene or higher, with interspersed domains of glassy carbon or graphite, may also be obtained.

When precursor molecules are pre-ordered on a substrate, it is thought that linear molecules provide an advantage in the ability to orient uniformly. Dienes, in particular, are thought to orient in substantial parallelism with double bonds in a staggered configuration, such that the double bonds of one molecule line up beside the single bonds of a neighboring molecule. Such an arrangement facilitates forming graphene with minimum application of energy because pi-bonded electrons can flow into aromatic configurations around adjacent carbon atoms as hydrogen radicals are dislodged.

At 108, energy is applied to the thin film to convert the film to graphitic carbon, glassy carbon, and/or graphene. The energy may be radiant energy, thermal energy, or plasma energy. Exemplary embodiments include UV radiation, inert gas plasma, for example argon plasma, and heating to a temperature of at least about 250° C. UV radiation may be applied using one or more UV lamps, a source of intense UV radiation, such as an LED source, a UV laser, or a combination thereof. UV wavelengths between about 170 nm to about 260 nm are typically used. The UV radiation may be applied to the entire substrate in a single exposure, or successive portions of the substrate may be exposed, as in a laser embodiment. The radiant energy of UV radiation applied to the substrate to accomplish the conversion to graphene is typically between about 1 mW/cm$^2$ and about 1 W/cm$^2$, such as between about 20 mW/cm$^2$ and about 50 mW/cm$^2$, for example about 25 mW/cm$^2$, and may be applied for a duration between about 10 seconds and about 10 minutes, for example about 1 minute. Alternately, an intense UV source may be applied for a shorter duration. For example pulses from an excimer laser such as a xenon, argon fluorine, or krypton fluorine laser of duration 1 nsec to 50 nsec may be used, with suitable power, to deliver converting radiation to successive treatment areas of the substrate.

Alternately, the substrate may be exposed to an activated gas, such as a plasma, radical gas, or electron gas to form graphene, graphitic carbon, or glassy carbon from the hydrocarbon layer. A plasma or radical gas of a species or mixture that is substantially unreactive to hydrocarbons is typically used, such as a plasma comprising a noble gas. A remote plasma or an in-situ plasma, such as an inductively coupled plasma, may be used, typically with weak or no bias applied to the substrate. Exposure to plasma may be useful in increasing grain size of graphene formed from a pre-ordered film by catalyzing bonding across grain boundaries.

The properties of a graphitic carbon layer, or a glassy carbon layer, formed by methods herein may be controlled by adjusting the precursor mixture composition, the surface properties, and/or the film formation conditions. As noted above, forming a hydrocarbon film having a thickness less than about 5 nm is conducive to formation of graphene. A thicker hydrocarbon film, such as between about 5 nm and about 20 nm, will form a glassy carbon film having graphene domains. Such a film is typically between about 50% graphene and about 80% graphene, with the balance being glassy carbon domains. Such films have electrical properties that are intermediate between those of graphene and those of glassy carbon, depending on grain size. Such properties may also be adjusted by providing more three-dimensional molecules in the precursor. Molecules with significant non-planar structure provide pathways for a carbon matrix to grow in three dimensions, rather than only two dimensions. Thus, including precursor molecules with significant non-planar structure encourages formation of non-graphene domains, which may be used to control the properties of the resulting film.

In one embodiment, a precursor solution is formed by mixing pyrene, 1,3 pentadiene, and ethanol as a solvent. A molar ratio of 1,3 pentadiene to pyrene is typically greater than 1. As described above, the pyrene is included as a graphene template molecule to facilitate organization of a large-grain graphene network, so the molar ratio of 1,3 pentadiene to pyrene may be any arbitrarily high number, such as between about $10^0$ and about $10^9$, such as between about 1 and about 100, for example about 50. The mixture may have any concentration of ethanol, for example up to about 75% ethanol, but will typically be between about 0% and about 50% ethanol by volume, for example about 30% ethanol by volume. It should be noted that either pyrene or 1,3 pentadiene alone, with or without solvent, may be used to make graphene by adjusting the film formation conditions and energy input to the conversion reaction accordingly.

The precursor solution described above is applied to a substrate. The ethanol content of the mixture may be adjusted to improve coating depending on the nature of the substrate. In one aspect, the precursor solution is applied by a spin-on process in which the substrate is rotated at a rate of 100 rps while an aliquot of between about 10 μL to about 100 μL, such as between about 30 μL and about 70 μl, for example about 50 μL, of the precursor mixture is dropped near the center of the substrate. Rotation is maintained for a period of 15 sec to 3 minutes, depending on viscosity of the precursor mixture, for example about 30 sec. Application of the precursor mixture to the substrate is typically performed at a temperature between about −10° C. and about 200° C., such as between about 0° C. and about 100° C., for example about 25° C. or room temperature. Depending on the substrate, the precursor application may be performed under an inert atmosphere, such as nitrogen, argon, or hydrogen, or a combination thereof, typically at a nominal pressure such as atmospheric pressure, low vacuum, or slight overpressure (e.g. between about 0.9 atm and about 1.1 atm).

In other embodiments, the precursor may be applied to the substrate by disposing the substrate on a moving conveyor and translating the substrate beneath a spray dispenser that covers the substrate as it moves beneath. The precursor solution may also be applied by dipping, pouring, flowing, condensing, or any convenient process for wetting a substrate with a liquid.

The substrate coated with the thin film of precursor is dried at ambient or elevated temperature of up to about 150° C. under an inert atmosphere such as nitrogen, argon, or hydrogen, or a combination thereof, which may be stationary or moving. A drying agent or filter may be used in some embodiments to remove evaporated solvent from the vapor phase to accelerate drying. For example, the substrate coated above may be dried at 40° C. for about 5 minutes. It should be noted that a substrate coated with a thin film of hydrocarbon without use of a solvent, or even a pure hydrocarbon, may be dried to reduce the fluid film on the substrate to a non-fluid stationary film of molecular hydrocarbons from one layer thick to a few layers thick, for example up to five layers thick. Such a film may technically be a liquid, but if the layer is thin enough for surface energy to dominate thermal energy, the molecules will behave as if the layer is a solid, and the layer will be a stationary non-fluid layer.

The dried substrate is exposed to UV radiation by disposing the substrate on a support facing a UV source, such as a lamp or bank of lamps. The substrate support may be stationary or moving. For smaller substrates, a single UV lamp may provide radiation sufficient to convert the thin hydrocarbon film to graphene. For example, a single 200 or 300 mm substrate may be disposed on a support in a box having a single 75 W UV lamp and exposed to radiation from the lamp for 60 seconds to accomplish the conversion. A higher power lamp, or a plurality of lamps, may also be used and the duration adjusted accordingly. The substrate support may also move the substrate beneath the UV lamp or lamps at a speed commensurate with the power of the lamps to accomplish the desired irradiation.

In one aspect, formation of graphene may be accomplished using a staged UV exposure to increase the grain size of the resulting graphene film. A first exposure may partially convert the hydrocarbon film to graphene, leaving domains of graphene separated by domains of hydrocarbon, and a second exposure may complete the conversion to graphene or graphitic carbon. The staged exposure typically features a rest period between exposures to allow the film to stabilize prior to the second exposure. A staged exposure may include any desired number of exposures, and each exposure may feature radiation having the same power density or a different power density. In one aspect, a first exposure may substantially convert all hydrocarbon to graphene while subsequent exposures increase grain sizes by activating bonding across grain boundaries. The staged exposure may be accomplished in a single chamber or in multiple chambers. In one aspect, the staged exposure may feature a conversion exposure and an anneal exposure, the conversion exposure including one or more UV treatments and the anneal exposure including one or more UV treatments.

UV exposure for conversion to graphene is typically performed under a chemically inert flowing atmosphere. A purge gas is flowed through the chamber in which the substrate is disposed such that gases emitted by the substrate during conversion to graphene, which may include hydrogen, organic substances such as alcohols and peroxides, or other substances if other electronegative species are included in the pre-oriented film, may be removed. Inert gases suitable for such service include argon (or any noble gas), nitrogen, and hydrogen. During treatment of a 200 mm or 300 mm substrate, purge gas may be flowed through the chamber at a rate between about 1 sLm and about 10 sLm, for example about 5 sLm. Treatment of larger substrates, up to 6 $m^2$, may include flowing a purge gas at rates commensurate with the larger processing volume, for example between about 1 sLm and 100 sLm, for example about 20 sLm. Pressure is maintained near atmospheric pressure, and temperature is near ambient.

In another aspect, conversion to graphene may be accomplished by exposure to other forms of energy such as thermal energy, plasma, activated gas, or combinations thereof, which may be accompanies by UV radiation. In a staged exposure, each exposure may be any convenient combination of the energy source described above.

The method 100 may be repeated, if desired, on a single substrate to form graphene on portions of the substrate having different properties. For example, a substrate having metal and dielectric regions in a surface thereof may be subjected to a first graphene formation process that selectively forms graphene on the metal regions of the substrate, and then may be subjected to a second graphene formation process that selectively forms graphene on the dielectric regions of the substrate surface. In such a treatment, the precursor mixture for the second graphene formation process may be selected so that the precursor mixture preferentially wets the dielectric regions of the substrate surface, but does not wet the pre-deposited graphene film formed over the metal areas of the substrate surface.

Prior to forming a graphene, graphitic carbon, or glassy carbon film on a substrate, the substrate surface may be prepared or cleaned by any convenient method. For metal portions of the substrate, an acid wash may be used to remove surface oxide, or a reducing environment such as hydrogen plasma may be used to remove oxygen from the metal surface. For dielectric portions of the substrate, a non-reactive plasma, such as a noble gas plasma (e.g. helium, argon, neon, etc.) or a hydrogen plasma may be used to remove impurities. For silicon portions, oxide and other impurities may be removed by a dry clean process using fluorine chemistry such as the SICONI® process from Applied Materials, Inc., of Santa Clara, Calif. A wet or vapor HF treatment may also be used. For carbon portions of the substrate, an inert plasma as described above may be used to remove impurities from the substrate surface. If the substrate surface features portions having different compositions, such as metal portions and dielectric portions, treatments compatible with all portions may be performed. For example, an inert plasma may remove impurities from multiple materials in the substrate surface. Also, staged cleaning and surface preparation treatments may be performed wherein a first chemistry operates preferentially on a first material of the surface while a second chemistry operates preferentially on a second material of the surface. Finally, if planarization of the substrate surface prior to forming graphene, graphitic carbon, or glassy carbon is desired, an inert gas plasma with an appropriate substrate bias may be used to planarize the substrate, or a polishing method known in the art may be used.

Figure 2:
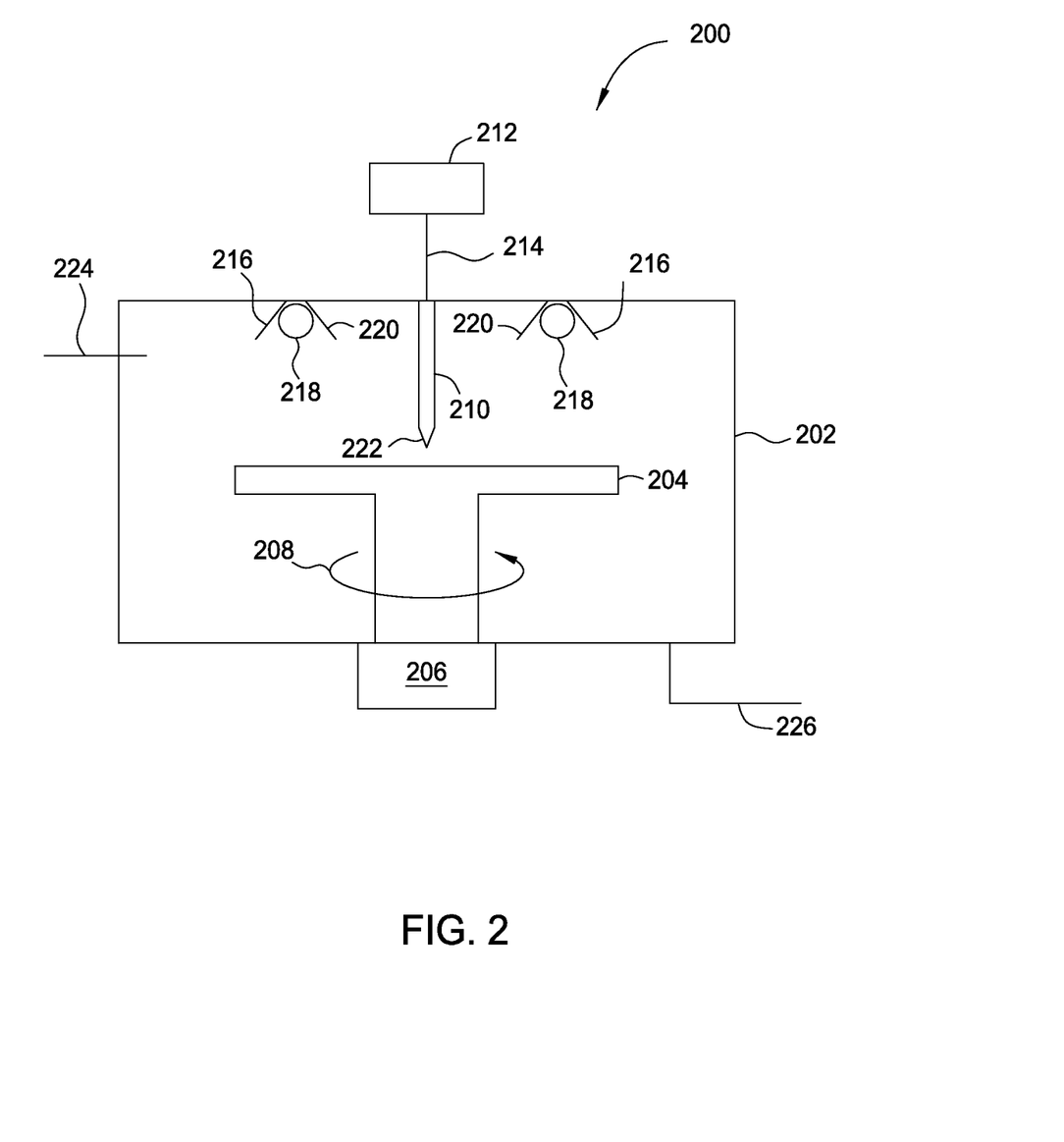
FIG. 2 is a schematic side view of an apparatus according to another embodiment.

FIG. 2 is a schematic cross-sectional view of an apparatus 200 according to an embodiment of the invention. The apparatus 200 may be used to practice parts of, or all of, the method 100. The apparatus 200 includes a chamber 202 with a substrate support 204 disposed therein. The substrate support 204 is connected to a motor 206 that rotates the substrate support 204, as indicated by arrow 208. Rotation of the substrate enables forming a thin film of liquid on a substrate.

An applicator 210 extends toward a central region of the substrate support 204, and a nozzle 222 applies a liquid precursor to a substrate disposed on the substrate support 204 near a center thereof. The motor 206 is capable of rotating the substrate support 204 at rates described above in connection with the method 100 of FIG. 1. The liquid precursor applied by the applicator 210 is sourced from a precursor source 212, which is generally a hydrocarbon source, for example a source of 1,3 pentadiene for practicing an embodiment of the method 100 disclosed above. The precursor source 212 may include multiple sources of different substances, for example a source of 1,3 pentadiene, a source of pyrene, and a source of ethanol, with appropriate valving and controls (not shown) for blending a precursor mixture. The applicator 210 is connected to the precursor source 212 by a conduit 214.

The apparatus 200 may have one or more radiant energy assemblies 216, each radiant assembly 216 including a radiant source 218 and a waveguide 220, which may be a reflector. The radiant sources 218 may include thermal sources and UV sources. In one embodiment, a single radiant energy assembly 216 is a UV lamp assembly. Power is naturally coupled to the radiant sources 216, and is not shown in FIG. 2. The radiant sources 216 may be controlled to irradiate a substrate on the substrate support 204 according to any of the embodiments of the method 100, as described above.

Gases may be provided to the chamber 202 by a gas inlet 224, and may be removed by a gas outlet 226. If desired, the substrate support 204 may include thermal control features, as is known in the art.

Figure 3A:
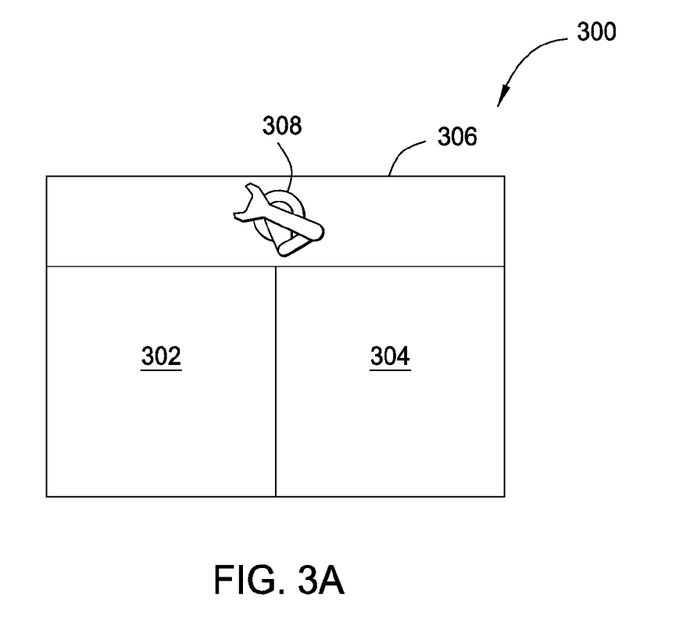
FIG. 3A is a plan view of an apparatus according to another embodiment.
Figure 3B:
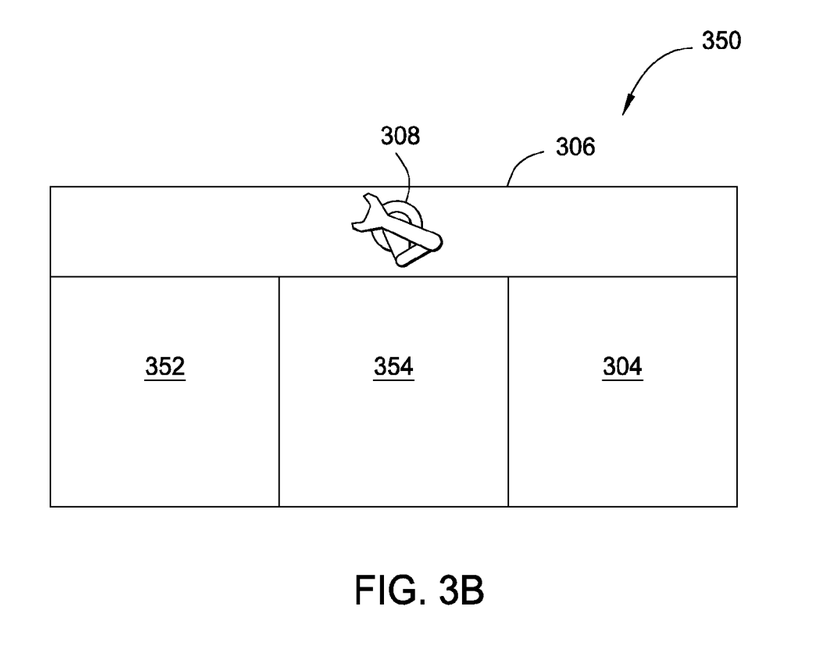
FIG. 3B is a plan view of an apparatus according to another embodiment.

In another embodiment, an apparatus for forming a graphene film may have two chambers, each of which performs part of the graphene formation process. In one embodiment, a deposition chamber forms a thin pre-ordered hydrocarbon precursor film on a substrate, while a cure chamber exposes the film to energy to form graphene. If desired, the two chambers may be coupled to a front-end module that moves substrates into and out of the two chambers. FIGS. 3A and 3B are plan views of two embodiments 300 and 350. In the embodiment 300 of FIG. 3A, a first chamber 302 may be a deposition chamber for forming a hydrocarbon film on a substrate, and a second 304 may be a cure chamber. A substrate handling module 306 is coupled to the first chamber 302 and the second chamber 304 to load and unload substrates from the two chambers. The substrate handling module 306 may have a robot 308 to manipulate substrates.

In the embodiment 350 of FIG. 3B, a first chamber 352 is included, which may be a substrate pre-treatment chamber, for example a cleaning chamber, which may be a wet clean or a dry clean chamber, as described above. Alternately, the first chamber 352 may be a deposition chamber. A second chamber 354 may be a deposition chamber, if the first chamber 352 is a pre-treatment chamber, or a drying chamber, if the first chamber 352 is a deposition chamber. In either of the embodiments 300 and 350, a staging module may be disposed between the substrate handling module 306 and the chambers, if desired. The staging module may be useful to control substrate throughput, and in some embodiments the staging module may serve as a load-lock for vacuum processes.

While the foregoing is directed to embodiments of the present invention, other and further embodiments of the invention may be devised without departing from the basic scope thereof, and the scope thereof is determined by the claims that follow.

The invention claimed is:

1. A method of growing graphitic carbon on a substrate, comprising:
   providing a precursor comprising:
      a linear conjugated hydrocarbon selected from 1,3-pentadiene, 1,3-hexadiene, 2,4-pentadiene, 2,4-hexadiene, and 1,3,5-heptatriene, and
      a solvent;
   depositing a hydrocarbon layer from the precursor on a substrate;
   evaporating the solvent before applying energy to the hydrocarbon layer; and
   forming a graphitic layer from the hydrocarbon layer by applying energy to the hydrocarbon layer.

2. The method of claim 1, wherein the precursor further comprises a polynuclear aromatic compound.

3. The method of claim 1, wherein the depositing a hydrocarbon layer comprises adhering molecules from the precursor to a surface of the substrate.

4. The method of claim 3, wherein the precursor further comprises a template.

5. The method of claim 4, wherein the precursor has a viscosity less than about 3.0 cP at room temperature.

6. The method of claim 1, wherein the depositing a hydrocarbon layer comprises applying the precursor to the substrate as a liquid.

7. The method of claim 1, wherein the energy is selected from the group consisting of UV energy, plasma energy, thermal energy, and combinations thereof.

8. The method of claim 1, wherein the precursor has a viscosity less than about 3.0 cP at room temperature.

9. The method of claim 1, wherein the precursor further comprises an oxygen-containing solvent.

10. The method of claim 9, wherein the hydrocarbon layer contains trace quantities of the oxygen-containing solvent.

11. The method of claim 1, wherein the graphitic carbon layer is at least about 80% graphene.

12. A method of forming graphene on a substrate, comprising:
    providing a precursor comprising a linear unsaturated hydrocarbon selected from 1,3-pentadiene, 1,3-hexadiene, 2,4-pentadiene, 2,4-hexadiene, and 1,3,5-heptatriene, an aromatic hydrocarbon, and a solvent;
    depositing molecules from the precursor on the substrate; and
    evaporating the solvent before applying energy to the molecules; and
    reacting the molecules to form graphene by applying energy to the molecules.

13. The method of claim 12, wherein the solvent is an oxygen-containing solvent.

14. The method of claim 1, wherein the solvent is evaporated at a temperature of about 150° C. or less.

15. The method of claim 12, wherein the solvent is evaporated at a temperature of about 150° C. or less.

16. The method of claim 1, wherein the solvent is an aprotic solvent.

17. The method of claim 16, wherein the aprotic solvent is benzene.

18. The method of claim 12, wherein the solvent is an aprotic solvent.

19. The method of claim 18, wherein the aprotic solvent is benzene.

\* \* \* \* \*

UNITED STATES PATENT AND TRADEMARK OFFICE
CERTIFICATE OF CORRECTION

PATENT NO. : 9,595,436 B2  
APPLICATION NO. : 14/425578  
DATED : March 14, 2017  
INVENTOR(S) : Cara Beasley et al.

Page 1 of 1

It is certified that error appears in the above-identified patent and that said Letters Patent is hereby corrected as shown below:

In the Specification

In Column 3, Line 65, delete "deriviatives" and insert -- derivatives --, therefor.

In Column 5, Line 6, delete "hydrophillic" and insert -- hydrophilic --, therefor.

In Column 7, Line 2, delete "70 µl," and insert -- 70 µL, --, therefor.

Signed and Sealed this  
Sixteenth Day of May, 2017

Michelle K. Lee  
*Director of the United States Patent and Trademark Office*